United States Patent
Braithwaite

(10) Patent No.: US 7,288,988 B2
(45) Date of Patent: Oct. 30, 2007

(54) ADAPTIVE PREDISTORTION LINEARIZED AMPLIFIER SYSTEM EMPLOYING SELECTIVE SAMPLING

(75) Inventor: Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 11/401,530

(22) Filed: Apr. 11, 2006

(65) Prior Publication Data

US 2006/0232332 A1    Oct. 19, 2006

Related U.S. Application Data

(60) Provisional application No. 60/670,907, filed on Apr. 13, 2005.

(51) Int. Cl.
*H03F 1/26* (2006.01)
(52) U.S. Cl. .................... 330/149; 330/136
(58) Field of Classification Search ........ 330/136; 375/297; 455/114.3
See application file for complete search history.

(56) References Cited

U.S. PATENT DOCUMENTS

| | | | |
|---|---|---|---|
| 4,053,846 A | 10/1977 | Acker | 330/279 |
| 4,985,688 A | 1/1991 | Nagata | 331/123 |
| 6,298,096 B1 | 10/2001 | Burgin | 375/296 |
| 6,512,417 B2 * | 1/2003 | Booth et al. | 330/149 |
| 6,531,917 B2 | 3/2003 | Yamamoto et al. | 330/149 |
| 6,919,764 B2 | 7/2005 | Kenington et al. | 330/149 |
| 6,975,167 B2 | 12/2005 | Saed | 330/149 |
| 2004/0130394 A1 | 7/2004 | Mattsson et al. | 330/149 |
| 2005/0195919 A1 | 9/2005 | Cova | 375/297 |
| 2005/0201491 A1 | 9/2005 | Wei | 375/326 |
| 2005/0254595 A1 | 11/2005 | Song et al. | 375/297 |

OTHER PUBLICATIONS

PCT International Search Report and Written Opinion for International Application PCT/US06/13529 dated Feb. 9, 2007, 8 pages.

* cited by examiner

*Primary Examiner*—Steven J. Mottola
(74) *Attorney, Agent, or Firm*—Myers Dawes Andras & Sherman LLP

(57) ABSTRACT

An adaptive predistortion linearized amplifier system employing selective sampling is disclosed. Two selective sampling methods of identifying valid measurements using information from the input signal are disclosed. The selective sampling process improves the convergence properties of tuning algorithms based on minimizing the gain error variance. It also reduces the number of data samples processed by the estimator used in the tuning process.

17 Claims, 12 Drawing Sheets

ADAPTIVE PREDISTORTION LINEARIZED AMPLIFIER SYSTEM EMPLOYING SELECTIVE SAMPLING

RELATED APPLICATION INFORMATION

The present application claims priority under 35 USC 119(e) to provisional patent application Ser. No. 60/670,907, filed Apr. 13, 2005, the disclosure of which is incorporated herein by reference in its entirety.

FIELD OF THE INVENTION

The present invention relates to predistortion linearized amplifier systems and related methods. More particularly, the present invention relates to adaptive predistortion systems and methods.

BACKGROUND OF THE INVENTION

Nonlinearities in the gain of a power amplifier are considered undesirable because intermodulation distortion (IMD) is generated for input signal formats with varying amplitude. Predistortion is a method of compensating for a power amplifier with nonlinear gain by producing an inverse gain in an attempt to make the combined gain linear. When the system is linear, the overall gain is constant for any input power level. The variance of the gain over the range of input power levels is a measure of the nonlinearity of the system.

A predistortion module preceding the main amplifier reduces output distortion only when tuned properly. In order to tune the predistortion adaptively, it is necessary to measure the input and output of the main amplifier and estimate the inverse gain characteristics. If the input and output samples are obtained from log-detectors, the differential log measurement provides information regarding the gain. Unfortunately, the differential log measurements are not reliable because outlier measurements with large errors are possible. Such outlier measurements corrupt the search process for the optimal tuning parameters.

Accordingly a need presently exists for a predistortion approach which can address the above noted problems and provide more reliable adaptive predistortion for amplifier linearization.

SUMMARY OF THE INVENTION

In a first aspect the present invention provides an adaptive predistortion linearized amplifier system comprising an input receiving an input signal, a predistorter coupled to the input and performing a predistortion operation on the input signal using predistortion coefficients and providing a predistorted input signal, a power amplifier receiving and amplifying the predistorted input signal and providing an amplified signal, an output coupled to the power amplifier and providing the amplified signal as an output signal and an adaptation circuit coupled to the input and output and receiving sampled input and output signals therefrom. The adaptation circuit comprises a selective sampling circuit providing a reduced number of samples derived from the sampled input and output signals using a signal characteristic related to the input signal magnitude and an estimator coupled to the selective sampling circuit and performing an adaptation operation using the reduced number samples to determine updated predistortion coefficients. The adaptation circuit is coupled to the predistorter and provides the updated predistortion coefficients to the predistorter.

In a preferred embodiment of the adaptive predistortion linearized amplifier system the adaptation circuit further comprises an envelope detector coupled to receive the sampled input signal. The signal characteristic related to the input signal magnitude may comprise the sampled input signal envelope and the selective sampling circuit selects local peaks of the envelope. Alternatively, the signal characteristic related to the input signal magnitude may comprise the rate of change of the sampled input signal envelope. More specifically the signal characteristic may comprise the ratio of the rate of change of the sampled input signal envelope to the magnitude of the signal envelope. The reduced number of samples provided to the estimator preferably comprises a set of sample triples, each triple comprising a sample related to the difference in log magnitude between the sampled input signal and sampled output signal, a sample related to the difference in phase between the sampled input signal and the sampled output signal, and the sampled input signal envelope. Alternatively, the reduced number of samples provided to the estimator may comprise a set of sample triples, each triple comprising a sampled input signal, a time aligned sampled output signal, and a time aligned sampled input signal envelope. The input signal may be an analog RF modulated signal and the predistorter performs an analog predistortion operation on the input signal. Alternatively, the input signal may be a digital baseband signal and the predistorter performs a digital predistortion operation on the input signal, and the amplifier system further comprises a digital to analog converter and up converter circuit coupled between the predistorter and the power amplifier. The adaptation circuit may comprise a differential log detector coupled to receive time aligned samples of the sampled input signal and sampled output signal and providing a sampled log magnitude difference signal related to the difference in log magnitude of the sampled input signal and sampled output signal and a sampled phase difference signal related to the difference in phase between the sampled input signal and sampled output signal. The sampled input signal envelope and the output of the differential log detector are provided to the selective sampling circuit. Alternatively, the output of the selective sampling circuit is provided to the differential log detector and the differential log detector operates on a reduced set of sampled input signals and sampled output signals.

According to another aspect the present invention provides a method for adaptive predistortion of an amplifier system having an input, an output and a power amplifier. The method comprises receiving an input signal at the input of the amplifier system, predistorting the input signal using predistortion coefficients, amplifying the predistorted input signal and providing the amplified signal to the output as an output signal. The method further comprises sampling the input signal to provide input signal samples, and sampling the output signal to provide output signal samples. The method further comprises reducing the number of input and output samples using a characteristic of the input signal related to the input signal magnitude and adaptively adjusting the predistortion coefficients using the reduced number of samples.

In a preferred embodiment of the method, reducing the number of input and output samples may comprise detecting the envelope of the input signal and selecting input samples having an envelope value which is the peak value within a group of samples. The envelope values corresponding to the selected samples may be used along with the selected samples for adaptively adjusting the predistortion coefficients. Alternatively, reducing the number of input and output samples may comprise selecting input samples having a rate of change of envelope value below a first threshold and an envelope value above a second threshold.

According to another aspect the present invention provides a method for selecting a subset of time aligned input and output samples of an amplifier system for use in adaptive predistortion of the amplifier system. The method comprises determining the value of the envelope of the input signal samples or another value related to the input signal magnitude, comparing the value among a group of N samples, selecting the input sample with the largest value in the group and selecting an output sample time aligned with the selected input sample.

In a preferred embodiment the method further comprises determining if the input sample is at an endpoint of the group of N samples and only selecting the sample if the sample is not at an endpoint.

According to another aspect the present invention provides a method for selecting a subset of time aligned input and output samples of an amplifier system for use in adaptive predistortion of the amplifier system. The method comprises determining the value of the envelope of the input signal samples or another value related to the input signal magnitude, determining the rate of change of said value, comparing the rate of change to a threshold level, selecting the input sample if the rate of change is below the threshold level and selecting an output sample time aligned with the selected input sample.

In a preferred embodiment the method further comprises determining if the value is greater than a second threshold and only selecting said input sample if the value is greater than the second threshold.

Further features and aspects of the invention are set out in the following detailed description of the invention.

DETAILED DESCRIPTION OF THE INVENTION

Figure 4:
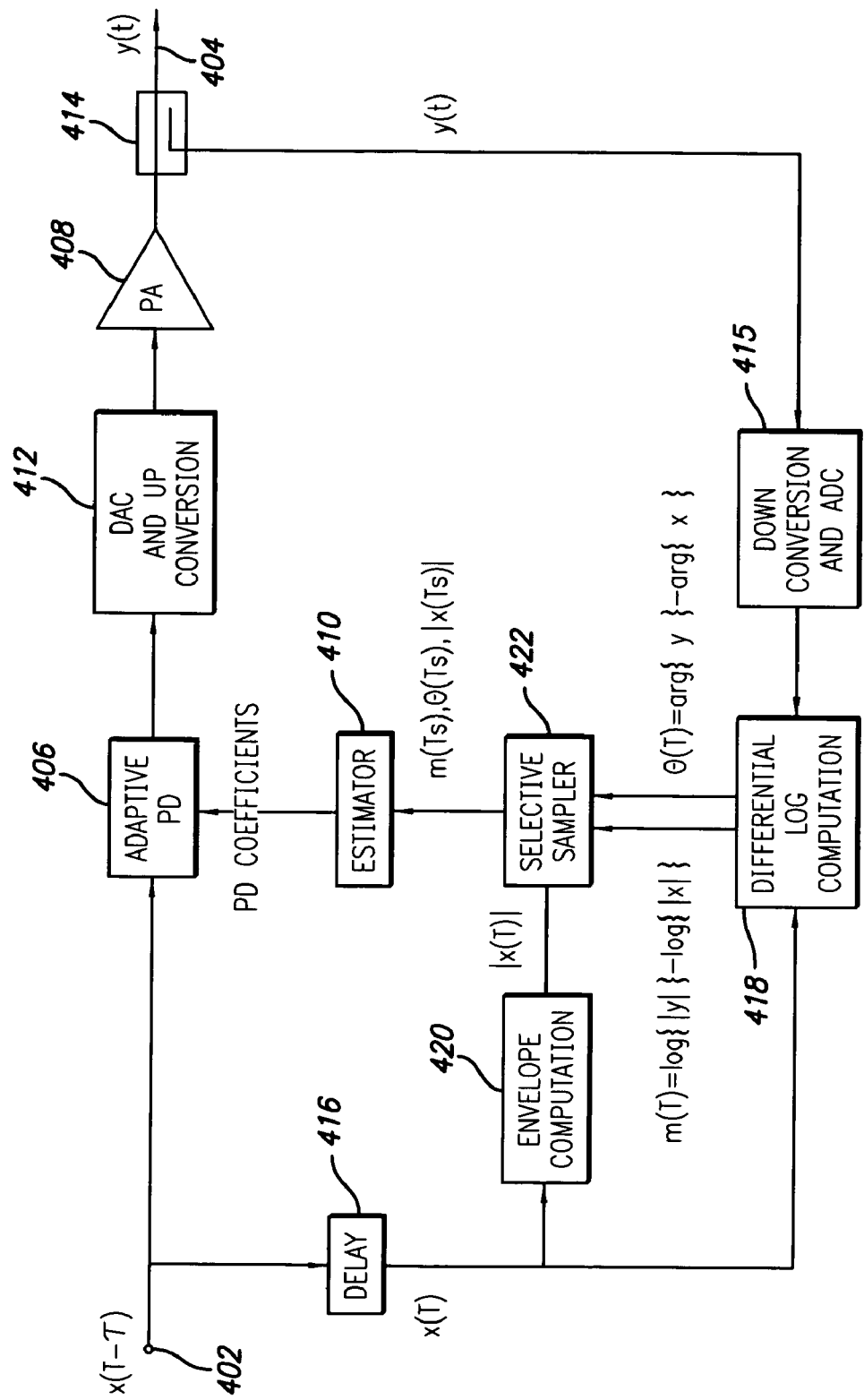
FIG. 4 is a block schematic drawing of a predistortion linearized amplifier system in accordance with the present invention employing digital predistortion and sampling of the output before differential log computation, followed by selective sampling.
Figure 5:
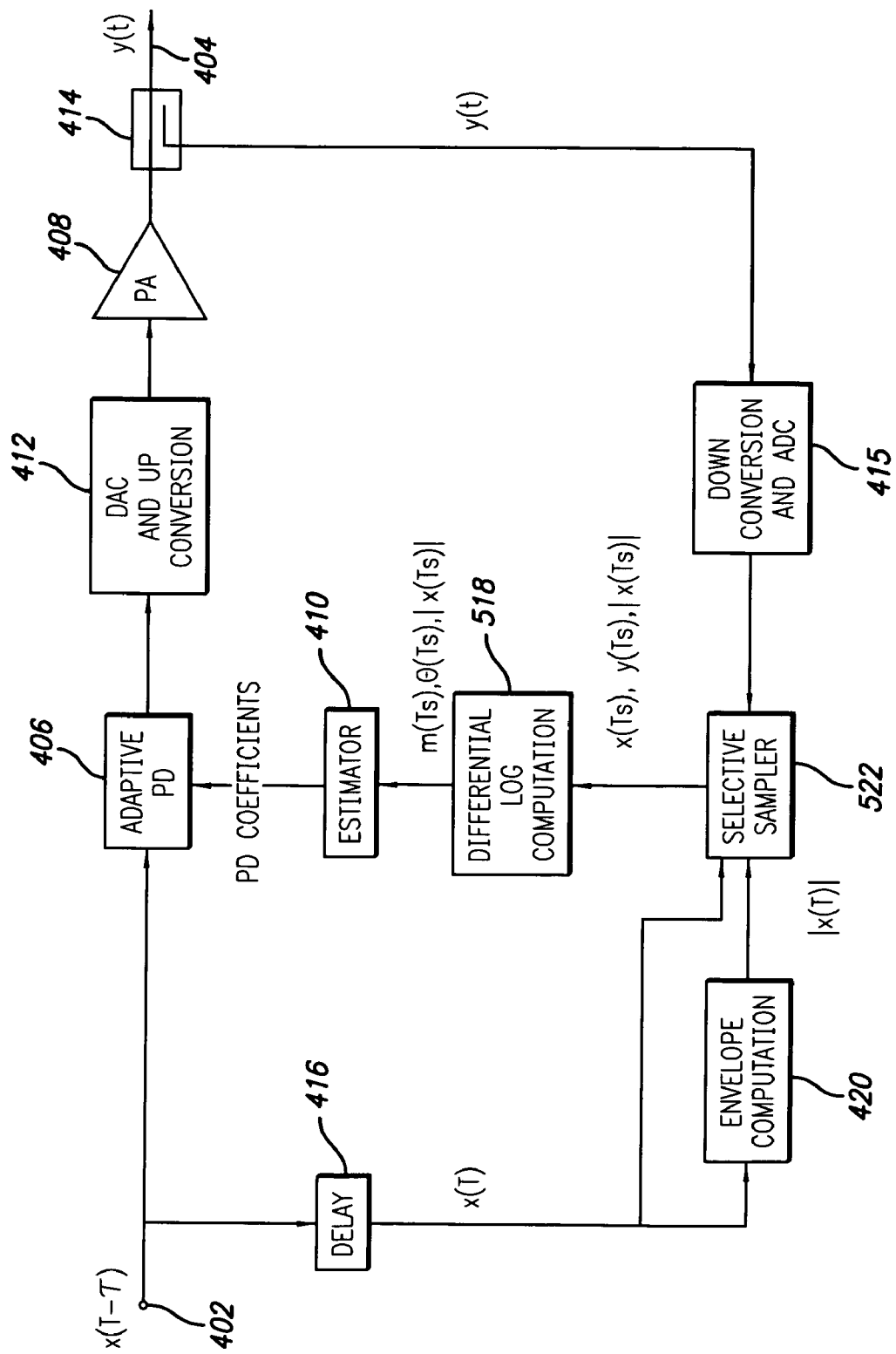
FIG. 5 is a block schematic drawing of an alternate embodiment of a predistortion linearized amplifier system in accordance with the present invention employing digital predistortion, sampling of the output before applying selective sampling, followed by differential log computation.
Figure 6:
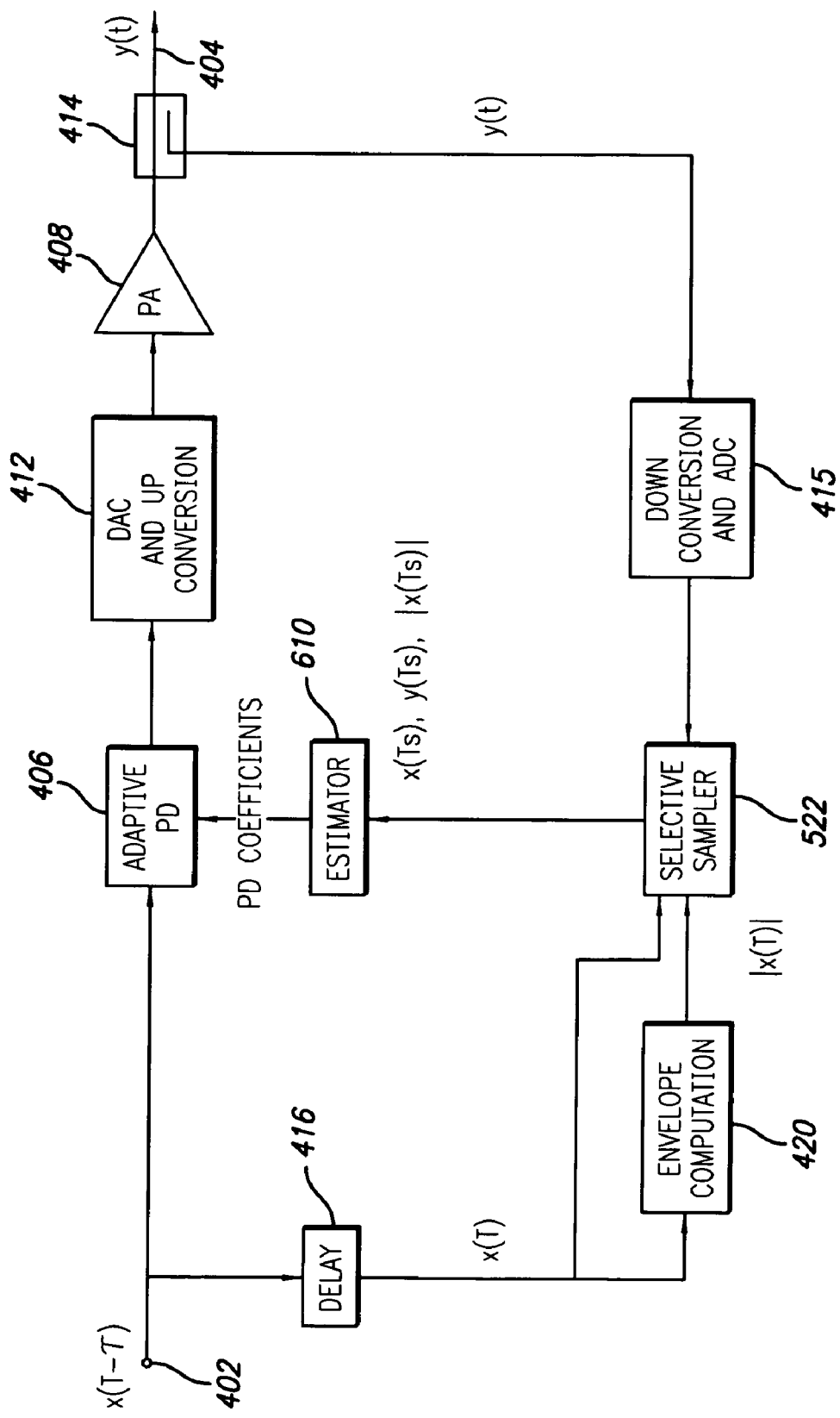
FIG. 6 is a block schematic drawing of an alternate embodiment of a predistortion linearized amplifier system in accordance with the present invention employing digital predistortion, sampling of the output before applying selective sampling, with no differential log computation before the estimator.

The present invention provides an adaptive predistortion linearized amplifier system employing selective sampling of the amplifier input and output. Predistortion can be achieved in various ways depending on the input signal, which can be digital or analog. An analog input can be a baseband signal, or a signal already modulated to IF or RF frequencies (where the RF carrier frequency is the same for both the input and output signals). The present invention is applicable to any of these predistortion configurations. A block diagram of a system comprising an analog adaptive predistortion module and a power amplifier is shown in three embodiments in FIGS. 1-3. FIGS. 4-6 in turn correspond to three embodiments employing a digital adaptive predistortion module and a power amplifier.

Figure 1:
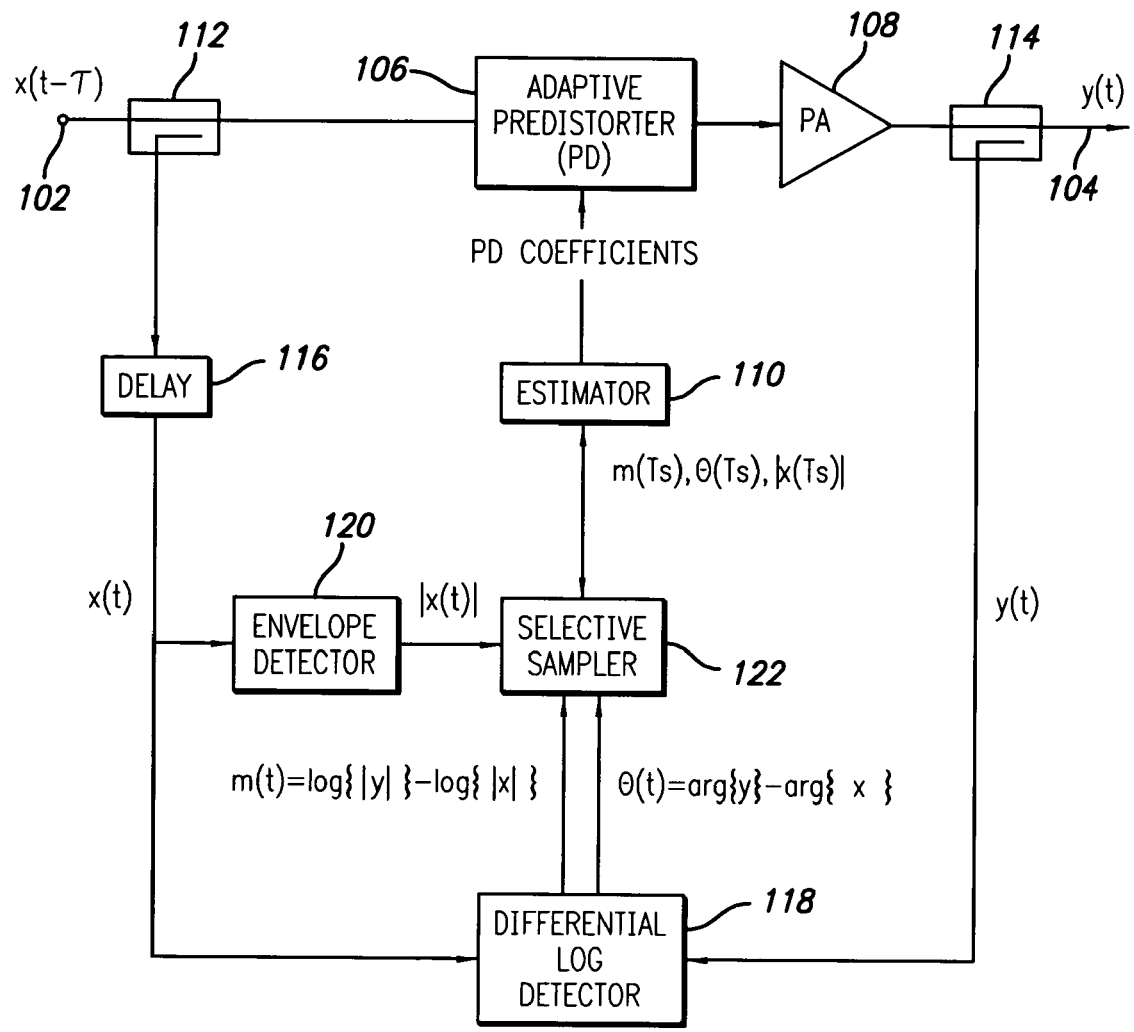
FIG. 1 is a block schematic drawing of a predistortion linearized amplifier system in accordance with the present invention employing analog predistortion and differential log detection followed by selective sampling.

Referring first to FIG. 1, a block schematic drawing of a predistortion linearized amplifier system is shown which employs analog predistortion and differential log detection followed by selective sampling. The amplifier system includes an input 102 which receives an analog communication signal, for example, a wide bandwidth modulated RF signal such as a CDMA, WCDMA or UMTS signal, which is provided to an analog predistorter 106 and the predistorted input signal is provided to a power amplifier (PA) 108 which provides the amplified signal to output 104. Predistorter 106 corrects for the nonlinearities in the power amplifier 108 which otherwise would introduce distortion into the output signal. The predistortion is adaptive and, as noted above, in order to tune the predistortion adaptively it is necessary to measure the input and output of the amplifier and estimate the inverse gain characteristics of the amplifier. More specifically, the predistortion gain is controlled by a set of coefficients that are estimated using an estimator 110 from time-aligned samples of the input and output signals provided from input and output sampling couplers 112, 114, respectively. The samples of the input and output signals are time aligned by delay 116 and provided to differential log detector 118 which is used to measure the instantaneous gain (as specified in more detail below). The estimator 110 correlates variations in the instantaneous gain with the input envelope, provided from envelope detector 120, from which beneficial coefficient adjustments are predicted. The selective sampler 122 selectively reduces the number of input and output samples used by the estimator 110 to compute the coefficient adjustments. In particular, in the preferred embodiment, the selective sampling is used to identify sampled triples (m, θ, |x|) that are considered reliable for use in adapting the predistortion system. Reliable triples have a low sensitivity to time misalignment between the samples of the triple and a low sensitivity to measurement noise. This improves the efficiency of the adaptation algorithm implemented in the estimator 110 and may be employed with a wide variety of different estimator and predistortion approaches. For example, a least squares estimator algorithm may be employed in estimator 110 as disclosed in U.S. patent application Ser. No. 10/881,476, filed Jun. 30, 2004, the disclosure of which is incorporated herein by reference in its entirety.

Figure 2:
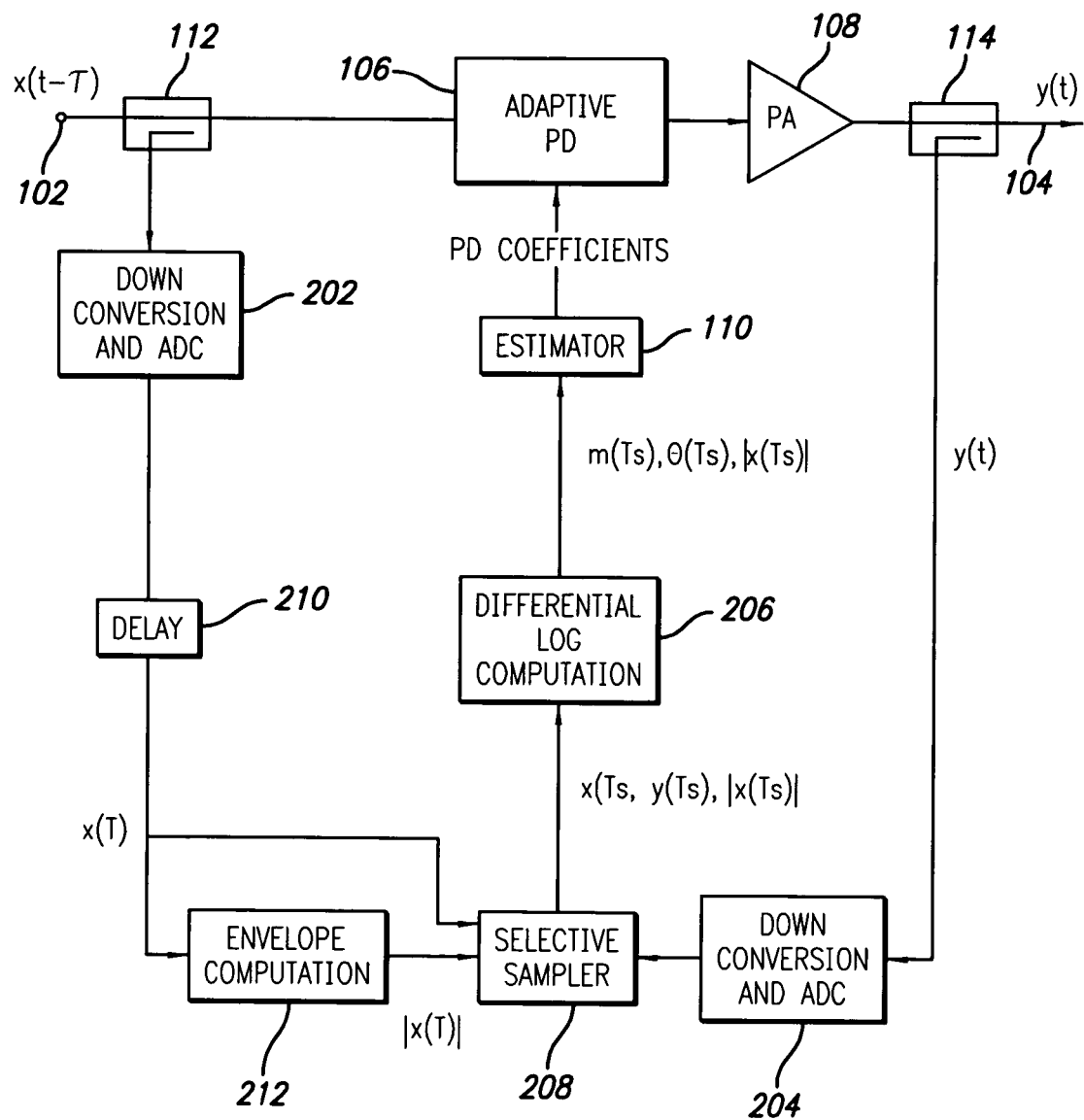
FIG. 2 is a block schematic drawing of an alternate embodiment of a predistortion linearized amplifier system in accordance with the present invention employing analog predistortion and sampling of the input and output before applying selective sampling and differential log computation.

Referring to FIG. 2 a block schematic drawing of an alternate embodiment of the predistortion linearized amplifier system is shown. The embodiment of FIG. 2 employs analog predistortion and sampling of the input and output before applying selective sampling and differential log computation. Like numbered components to the embodiment of FIG. 1 may be as described above. The embodiment of FIG. 2 differs in that the input and output analog samples are down converted to baseband and analog to digitally converted at respective down conversion/ADC circuits 202, 204 and the differential log computation is done digitally at differential log computation circuit 206. Selective sampling is done prior to the differential log computation to simplify that computation as well as provide more reliable samples for adaptation to estimator 110. More specifically, selective sampler 208 selectively reduces the number of triples comprising the digital input and output samples, time aligned via delay 210, and digital input envelope values from envelope computation circuit 212, to provide triples (x, y, |x|) that are considered reliable for use in adapting the predistortion system. These are provided to differential log computation circuit 206 which derives sampled triples (m, θ, |x|) which are provided to estimator 110. Estimator 110 may then operate on the reduced number of these sampled triples as in the embodiment of FIG. 1.

Figure 3:
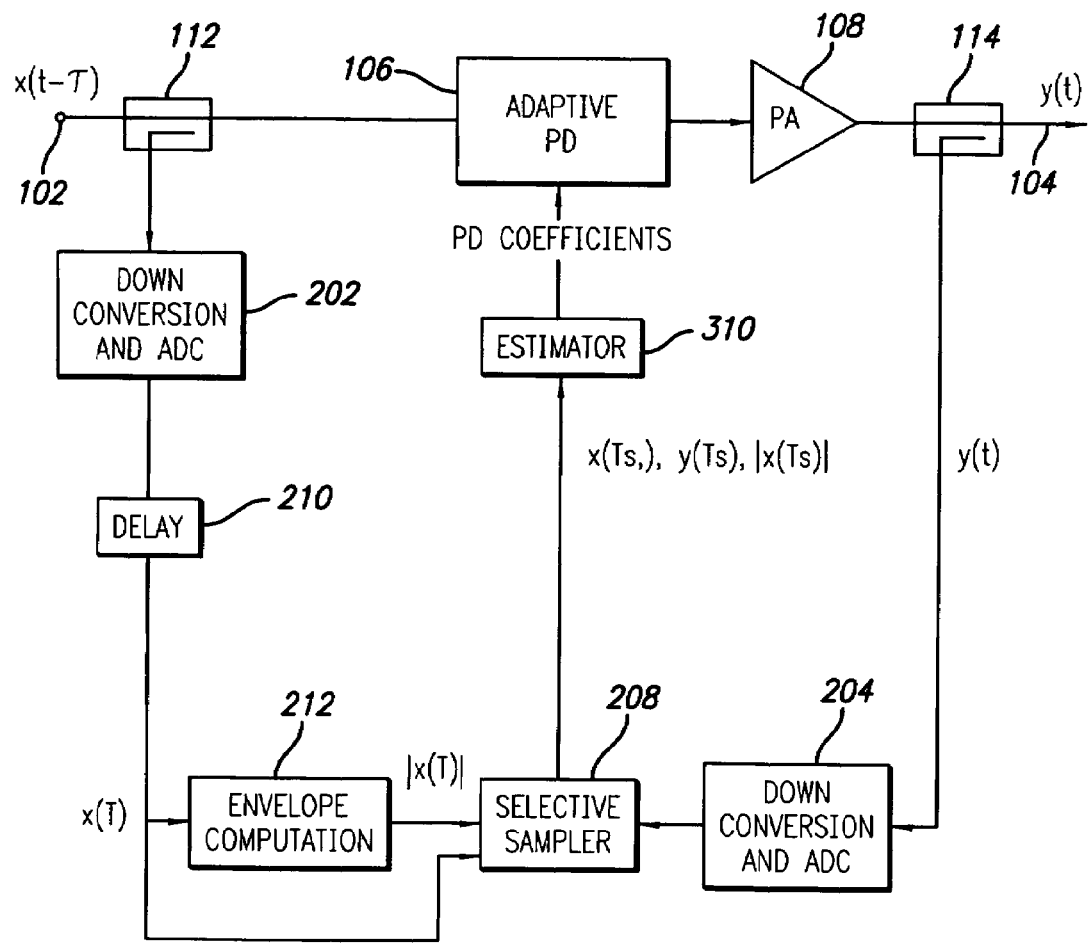
FIG. 3 is a block schematic drawing of another embodiment of a predistortion linearized amplifier system in accordance with the present invention employing analog predistortion and sampling of the input and output before applying selective sampling, with no differential log computation before the estimator.

Referring to FIG. 3 a block schematic drawing of an alternate embodiment of the predistortion linearized amplifier system is shown. The embodiment of FIG. 3 employs analog predistortion and sampling of the input and output before applying selective sampling, with no differential log computation before the estimator 310. Therefore, the only difference from the embodiment of FIG. 2 is that estimator 310 operates on triples (x, y, |x|) in adapting the predistortion coefficients, rather than triples (m, θ, |x|). A variety of suitable adaptation algorithms may be implemented in estimator 310, as known in the art, and will benefit from the added reliability afforded by the selectively reduced samples. The remaining like numbered components to the embodiments of FIGS. 1 and 2 therefore may be as described above.

Referring to FIG. 4 a block schematic drawing of an alternative embodiment of the predistortion linearized amplifier system employing digital predistortion and sampling of the output before differential log computation, followed by selective sampling is illustrated. The amplifier system includes an input 402 which receives a digital communication signal, for example, a wide bandwidth modulated baseband signal such as a CDMA, WCDMA or UMTS signal, which is provided to a digital predistorter 406 and the predistorted input signal is provided to a conventional DAC and up conversion circuit block 412 which provides a predistorted analog RF signal to power amplifier (PA) 408 which in turn provides the amplified signal to output 404. Predistorter 406 employs known digital predistortion techniques to correct for the nonlinearities in the power amplifier 408 which otherwise would introduce distortion into the output signal. The predistortion is adaptive as in the previously described embodiments, and in order to tune the predistortion adaptively it is necessary to measure the input and output of the amplifier and estimate the inverse gain characteristics of the amplifier. More specifically, the predistortion gain is controlled by a set of coefficients that are estimated using an estimator 410 from time-aligned digital samples of the input and output signals provided from the input and from output sampling coupler 414 via down conversion and ADC circuit block 415. The digital samples of the input and output signals are time aligned by delay 416 and provided to differential log computation circuit 418 which is used to calculate the instantaneous gain (as specified in more detail below). The estimator 410 correlates variations in the instantaneous gain with the input envelope, provided from envelope computation circuit 420, from which beneficial coefficient adjustments are predicted. The selective sampler 422 selectively reduces the number of input and output samples used by the estimator 410 to compute the coefficient adjustments. In particular, in the preferred embodiment, the selective sampling is used to identify sampled triples (m, θ, |x|) that are considered reliable for use in adapting the digital predistortion system. These may be used for any of a variety of known digital predistortion adaptation algorithms implemented by estimator 410.

Referring to FIG. 5 a block schematic drawing of an alternate embodiment of a predistortion linearized amplifier system employing digital predistortion, sampling of the output before applying selective sampling, followed by differential log computation is illustrated. Like numbered components to the embodiment of FIG. 4 may be as described above. The embodiment of FIG. 5 differs in that the selective sampling is done prior to the differential log computation to simplify that computation as well as provide more reliable samples for adaptation to estimator 410. More specifically, selective sampler 522 selectively reduces the number of triples comprising the digital input and output samples, time aligned via delay 416, and digital input envelope values from envelope computation circuit 420, to provide triples (x, y, |x|) that are considered reliable for use in adapting the predistortion system. These are provided to differential log computation circuit 518 which derives sampled triples (m, θ, |x|) which are provided to estimator 410. Estimator 410 may then operate on the reduced number of sampled triples as in the embodiment of FIG. 4. Since the differential log computation is performed on a reduced number of samples this embodiment may employ a less complex circuit 518 and/or may have some speed advantages over the embodiment of FIG. 4.

Referring to FIG. 6 a block schematic drawing of an alternate embodiment of a predistortion linearized amplifier system employing digital predistortion, sampling of the output before applying selective sampling, with no differential log computation before estimator is illustrated. The only difference from the embodiment of FIG. 5 is that estimator 610 operates on triples (x, y, |x|) rather than triples (m, θ, |x|) in adapting the predistortion coefficients. Suitable adaptation algorithms are known in the art and will benefit from the added reliability afforded by the selectively reduced samples. The remaining like numbered components to the embodiments of FIGS. 4 and 5 therefore may be as described above.

Next the theory of operation of the adaptive predistortion will be described in more detail before describing preferred embodiments of the selective sampler which will improve adaptation speed and reliability. Computing the gain from samples of the input and output signals is challenging. The gain comprises two components: magnitude and phase. Demodulating and digital sampling of the input and output signals provide baseband signals from which the gain could be computed. However, this would require significant digital signal processing in the form of a complex division. As an alternative, a logarithmic transformation can be performed on the baseband signals, allowing the log gain to be computed using subtraction. Detectors are commercially available that measure the difference of the logarithmic input and output signals directly at RF, providing both the log-magnitude and phase components of the log gain. These may advantageously be employed in the embodiment of FIG. 1. Alternatively, digital implementations may be employed in the other embodiments described above. Minimizing the variance of the log gain over the range of input signals creates a system response with improved linearity requiring fewer digital computations.

The instantaneous output power of the power amplifier is $$|y(t)|^2 = |G_0 \cdot x(t) + d(t)|^2 \approx |G_0|^2 \cdot |x(t)|^2 + 2 \cdot RE\{G_0^* \cdot x^*(t) \cdot d(t)\} + |d(t)|^2 \quad \text{(Eq. 1)}$$

where $G_0$ is the linear component of the combined power amplifier and predistorter gain (a complex constant); and d(t) is the distortion generated by the combination of the predistortion module and the main amplifier. The complex gain, $G_0$, can be written as $$G_0 = \exp\{m_0 + j\theta_0\} \quad \text{(Eq. 2)}$$

where $m_0$ is the magnitude term in dB's and $\theta_0$ is the phase term in radians. The instantaneous gain is $$G = \exp\{m + j\theta\} \quad \text{(Eq. 3)}$$

where $m-m_0$ and $\theta-\theta_0$ are variations in the magnitude and phase, respectively. The fractional gain error caused by the distortion d(t) is $$\frac{G_{error}}{G_o} = \exp\{(m - m_o) + j \cdot (\theta - \theta_o)\}, \quad \text{(Eq. 4)}$$
$$-1 \approx (m - m_o) + j \cdot (\theta - \theta_o)$$

where the approximation is valid when $|m-m_0|$ and $|\theta-\theta_0|$ are small. A differential log detector, whose inputs are x(t) and y(t), provides measurements of m and θ.

Let us look at the effect of distortion on the log measurements. The log of the output magnitude is written as $$\log\{|y(t)|\} = \frac{\log\{|y(t)|^2\}}{2}, \quad \text{(Eq. 5)}$$

where log{ } represent the natural logarithm. Using (Eq. 1) and (Eq. 5), this signal can be rewritten as $$\log\{|y(t)|\} = 0.5 \cdot \log\{|G_o|^2 \cdot |x(t)|^2 + |d(t)|^2\} + 0.5 \cdot \log \quad \text{(Eq. 6)}$$
$$\left\{1 + \frac{2 \cdot \text{Re}[G_o^* \cdot x^*(t) \cdot d(t)]}{|G_o|^2 \cdot |x(t)|^2 + |d(t)|^2}\right\}$$

or $$\log\{|y(t)|\} = \log\{|x(t)|\} + A(t) + B(t) + C. \quad \text{(Eq. 7)}$$

where $$A(t) = 0.5 \cdot \log\left\{1 + \frac{|d(t)|^2}{|G_o|^2 \cdot |x(t)|^2}\right\} \quad \text{(Eq. 8)}$$

$$B(t) = 0.5 \cdot \log\left\{1 + \frac{2 \cdot \text{Re}[G_o^* \cdot x^*(t) \cdot d(t)]}{|G_o|^2 \cdot |x(t)|^2 + |d(t)|^2}\right\} \quad \text{(Eq. 9)}$$

$$C = \log\{|G_o|\} \quad \text{(Eq. 10)}$$

Let us look at the dominant terms in the logarithmic expansion of (Eq. 8) and (Eq. 9). The full logarithmic expansion is $$\log\{1 + q\} = q - \frac{q^2}{2} + \frac{q^3}{3} - \ldots \quad \text{(Eq. 11)}$$

When the distortion power is much less than the linear power ($|d|^2 << |G_0|^2 |x|^2$), the following approximations can be made $$A(t) \approx 0 \quad \text{(Eq. 12)}$$

and $$B(t) \approx \frac{\text{Re}\{G_o^* \cdot x^*(t) \cdot d(t)\}}{|G_o|^2 \cdot |x(t)|^2 + |d(t)|^2}. \quad \text{(Eq. 13)}$$

If it is assumed that the distortion is memoryless and can be modeled as $$d(t) \approx G_{error}(t) \cdot x(t) \quad \text{(Eq. 14)}$$

where $G_{error}$ or is $$G_{error}(|x|) = \sum_{k=2}^{N} a_k \cdot |x(t)|^k. \quad \text{(Eq. 15)}$$

then $$B(t) \approx \text{Re}\left\{\frac{G_{error}}{G_o}\right\}. \quad \text{(Eq. 16)}$$

The magnitude portion of a differential log is $$m(t) = \log\{|y(t)|\} - \log\{|x(t)|\}. \quad \text{(Eq. 17)}$$

Using (Eq. 7), (Eq. 12), (Eq. 16), and (Eq. 17), we get $$m(t) \approx \log\{|G_o|\} + \text{Re}\left\{\frac{G_{error}}{G_o}\right\}. \quad \text{(Eq. 18)}$$

The phase difference measurement can also be viewed as a differential log:

$$j\theta(t) = j \cdot [\arg\{y(t)\} - \arg\{x(t)\}] = \log\left\{\frac{y}{|y|}\right\} - \log\left\{\frac{x}{|x|}\right\}. \quad \text{(Eq. 19)}$$

If (Eq. 14) is valid, we get $$j\theta(t) = \log\left\{\frac{G_o}{|G_o|}\right\} + \log\left\{1 + \frac{G_{err}}{G_o}\right\} - \log\left\{\left|1 + \frac{G_{err}}{G_o}\right|\right\} \quad \text{(Eq. 20)}$$

$$\approx j \cdot \arg\{G_o\} + \frac{G_{err}}{G_o} - \text{Re}\left\{\frac{G_{err}}{G_o}\right\}$$

This can be re-written as $$\theta(t) \approx \arg\{|G_o|\} + \text{Im}\left\{\frac{G_{err}}{G_o}\right\}. \quad \text{(Eq. 21)}$$

Note that both $\log\{|G_0|\}$ and $\arg\{G_0\}$ within (Eq. 18) and (Eq. 21) are constant values.

The ratio $G_{err}/G_0$, referred to as the "fractional gain error", represents the memoryless magnitude and phase nonlinearities normalized by the linear gain. It is desirable to tune the predistortion module to minimize the variance of fractional gain error. The cost function minimized for the magnitude component is $$J_{magn} = E\left[\left(\text{Re}\left\{\frac{G_{err}}{G_o}\right\}\right)^2\right] \approx E[m^2] - (\log\{|G_o|\})^2 \quad \text{(Eq. 22)}$$

where it is assumed that $E[\log\{|G_0|\}*\text{Re}\{G_{err}/G_0\}]=0$. Within (Eq. 22), E[ ] indicates an expected value based on a weighted ensemble averaging, $$E[z] = \frac{\sum_{k=1}^{N} w_k \cdot z_k}{\sum_{k=1}^{N} w_k}, \quad \text{(Eq. 23)}$$

where $z_k$ are samples of z, and $w_k$ is a weighting term (scalar) corresponding to the sample k. A similar cost function exists for the phase component:

$$J_{phase} = E\left[\left(\text{Im}\left\{\frac{G_{err}}{G_o}\right\}\right)^2\right] \approx E[\theta^2] - (\arg\{G_o\})^2 \quad \text{(Eq. 24)}$$

where it is assumed that $E[\arg\{G_0\}*\text{Im}\{G_{err}/G_0\}]=0$. Instead of minimizing the variance of the fractional gain error directly, the predistortion module is tuned to minimize the variance of the differential log measurements ($E[m^2]$ and $E[\theta^2]$). If all of the assumptions mentioned previously are valid, the tuning will be correct.

The key two assumptions made in the approximations used in (Eq. 22) and (Eq. 24) include:
1. The total distortion and noise power, $|d|^2$, is small compared to linear portion of the output power, $|G_0|^2|x|^2$.
2. The misalignment in time between the input signal, x(t), and output signal, y(t), at the differential log detector is minimal so that the cross-correlation between input and output signals is high.

There are instants where the assumptions are likely to be invalid. For example, when the envelope of input signal |x(t)| is near zero, assumption 1 is questionable. The distortion causes the output log measurement to be significantly higher than the input measurement, when the envelope of the input signal is near zero, causing the differential log measurement to glitch (spike). Such glitch measurements have a deleterious effect on the expected value measured using (Eq. 23) when $w_k$ is set to unity for all samples.

The time-alignment of the input and output signals at the differential log detector is also important. If the time-alignment is not exact, the differential log will detect the derivative of the input signal in addition to the variations in the fractional gain error. For example, consider the case of a linear power amplifier where the input and output measurements are misaligned in time by $\tau_0$. The magnitude measurement would be $$m = \log\{|y(t - \tau_o)|\} - \log\{|x(t)|\} \quad \text{(Eq. 25)}$$

$$= \log\{|G_o|\} + \log\left\{\frac{|x(t - \tau_o)|}{|x(t)|}\right\}$$

$$\approx \log\{|G_o|\} + \frac{\partial |x|}{\partial t} \cdot \frac{\tau_o}{|x|}$$

where the following Taylor series expansion is used in the approximation, $$|x(t - \tau_o)| \approx |x(t)| + \frac{\partial |x|}{\partial t} \cdot \tau_o. \quad \text{(Eq. 26)}$$

It is apparent from (Eq. 25) that the measurement m is most sensitive to time-alignment problems ($\tau_0$) when the input envelope |x| is changing rapidly (absolute value of $|x|^{-1}\delta|x|/\delta t >> 0$). Note that time misalignment includes memory effects within the power amplifier, which produces a time spread (dispersion) in the output signal as opposed to a single time delay.

Differential log measurements tend to be less reliable at low input power levels (compared to the average power). In addition, rapid changes in the envelope power level cause glitches if the time-alignment of the input and output is poor (relative to the derivative of the power). It is beneficial to ignore sampled measurements obtained under such conditions.

The preferred approach uses selective samples of the differential log-measurements (m and θ) to ensure that the approximations used in (Eq. 22) and (Eq. 24) are valid. That is, questionable samples are not included in (Eq. 23), by omission or by setting the corresponding weight $w_k$ to zero.

The criteria used to identify valid samples, discussed below, are based on the input signal envelope, |x(t)|. Alternatively, the criteria can be based on the input signal power or the log of the input signal power (or envelope). Also, in embodiments where differential log measurements are not used the criteria for choosing selective samples of the input and output may be based on the appropriate cost functions in place of (Eq. 22) and (Eq. 24).

Two approaches to selective sampling are disclosed that are based on the input envelope, |x|. Both approaches reject samples with low input levels and favor samples whose derivative of the input envelope is small relative to the instantaneous envelope level.

The first approach measures the input envelope and selects samples corresponding to the local peaks of |x|. One method of peak detection, employed in the implementations of the selective sampler shown in FIGS. 7 and 8 (for analog and digital input signals, respectively), is to segment the sequence into observation intervals of N samples (e.g., N=10) and identify the maximum from each interval. The maximum is retained as a valid sample if it is not an endpoint of the interval. The selected samples will be limited to local peaks of the input envelope; however, some local peaks will be rejected if they occur at an interval boundary. Once the samples are selected, the time-aligned measurements of the log magnitude and phase are output to the estimator or stored and output in blocks. Local peaks of the input envelope are desirable because the slope of the input envelope is near zero and the envelope level is large relative to the neighboring samples. Peak detection changes the distribution of the input envelope levels because a disproportional number of lower level samples are rejected. In terms of the log magnitude and phase, the variance of the selected samples tends to be significantly lower than the original sequence. Local peaks whose input level is lower than a given threshold are also rejected.

Note that peak detection can be based on the input power or log power instead of the input envelope without affecting the sample selection.

Figure 7:
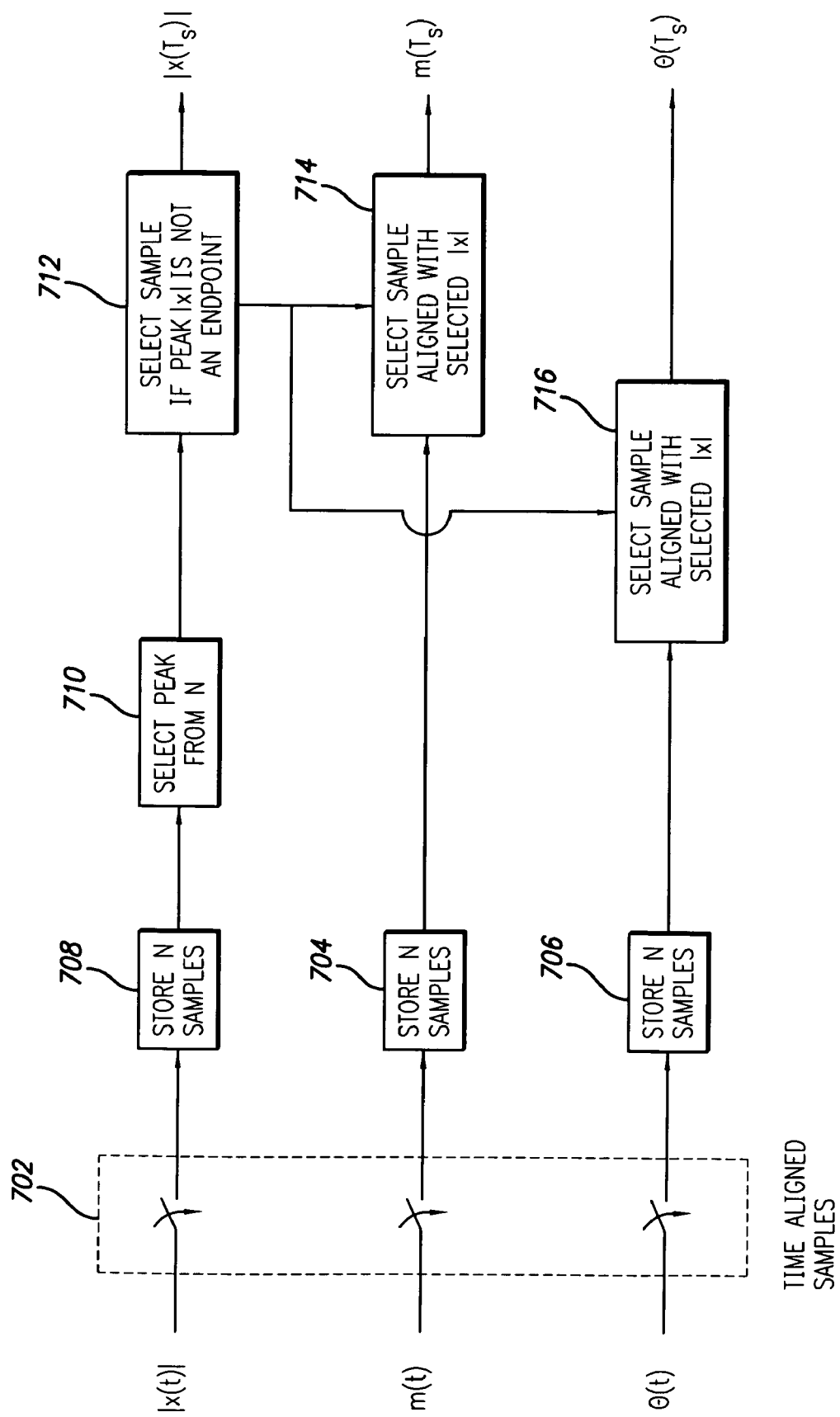
FIG. 7 is a first embodiment of a selective sampling circuit in accordance with the present invention with an analog input.

More specifically, referring to FIG. 7 an implementation of the first embodiment of the selective sampling circuit with an analog input is shown. This implementation may be employed for circuit 122 of FIG. 1 and the input signals may be time aligned analog signals (m, θ, |x|) as described therein. The analog input signals are converted to discrete samples at analog sampling circuit 702 which outputs digital samples for time aligned triples (m, θ, |x|). These are provided to respective to temporary storage locations 704, 706, 708 which each store N samples. The N envelope samples are compared at envelope magnitude selection circuit 710 which selects the peak envelope sample from the N stored samples. Circuit 712 checks if the selected sample is an endpoint and if not the sample is selected as valid. If valid the sample number is output to magnitude and phase sample selection circuits 714, 716, respectively, which output the corresponding magnitude and phase samples. The circuit of FIG. 7 may be implemented in a discrete circuit such as a FPGA or ASIC or the functional blocks after sampling circuit 702 may be implemented in a suitably programmed DSP.

Figure 8:
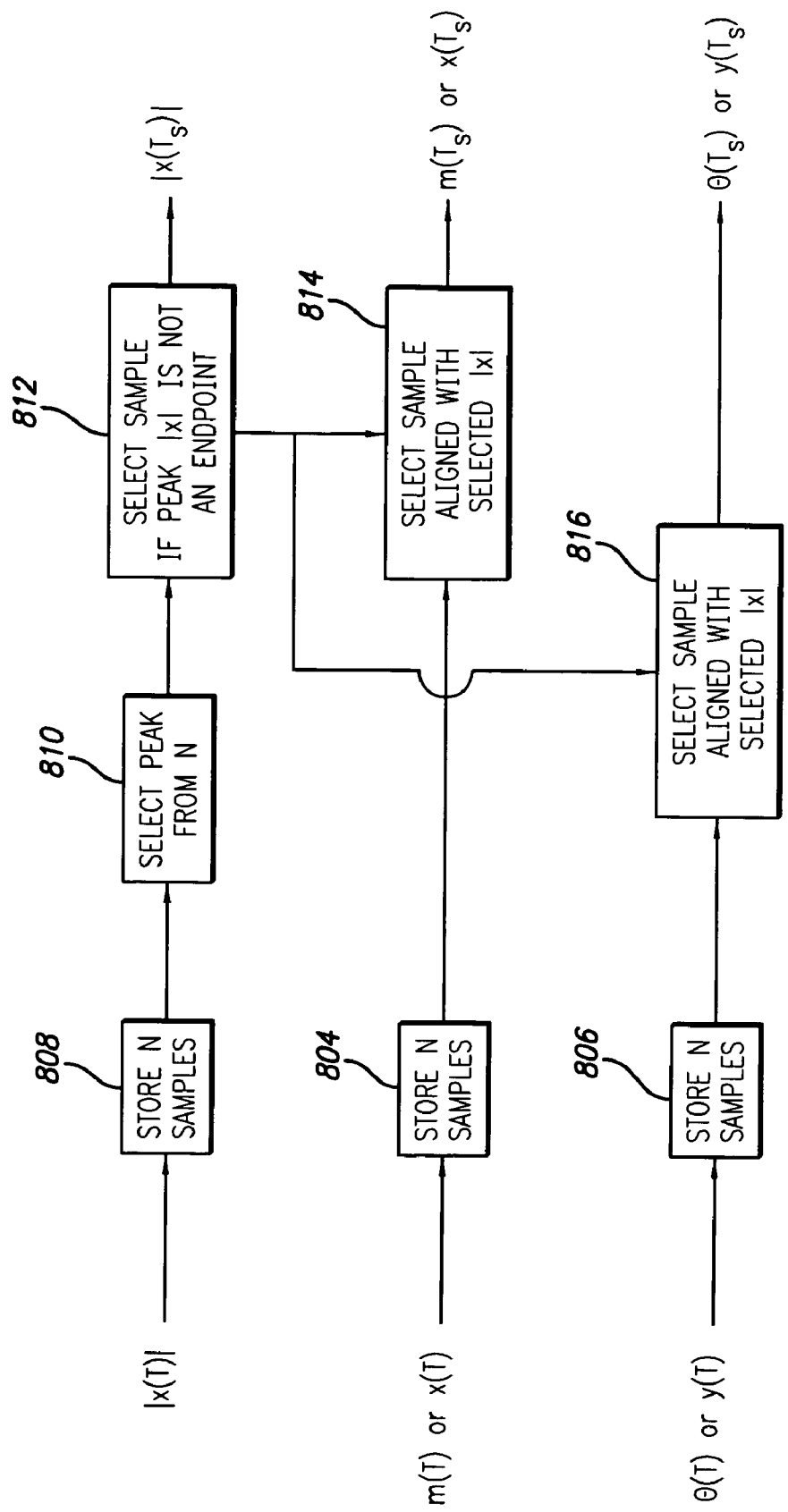
FIG. 8 is a first embodiment of a selective sampling circuit in accordance with the present invention with a digital input.

The implementation of the selective sampling circuit of FIG. 8 corresponds to embodiment 1 operating on digital samples, time aligned triples, as inputs. This implementation may be employed for the systems of FIGS. 2-6 and the circuit receives time aligned triples (m, θ, |x|) or (x, y, |x|) depending of the embodiment. The operation of the circuit corresponds to that of FIG. 7 after sampling circuit 702 and circuit blocks 804, 806, 808, 810, 812, 814 and 816 operate in the same manner as circuit blocks 704, 706, 708, 710, 712, 714 and 716 described above to select samples that are local peaks.

The second approach measures the ratio of the derivative of the input envelope and instantaneous input envelope:

$$\frac{\partial |x|}{|x|}, \quad (\text{Eq. 27})$$

where $\delta|x|$ is approximated, typically, by the difference between neighboring samples. The criteria for a valid sample becomes $$\partial|x| < \eta_1 \cdot |x| \text{ and } |x| > \eta_2 \cdot E[|x|], \quad (\text{Eq. 28})$$

where $\eta_1$ and $\eta_2$ are thresholds (typical value for $\eta_2$ is 0.3). The first threshold limits the input derivative of selected samples; the second threshold rejects samples obtained from low input levels. The optimal value of $\eta_1$ depends, in part, on the technique used to measure of the derivative $\delta|x|$. It requires normalization if the sampling rate is altered or if the estimates are obtained using a high pass filter. In general, a smaller value of $\eta_1$ should be selected if the time-alignment between the input and output signals entering the differential log detector is imprecise or the memory within the power amplifier is not small. With the appropriate adjustments to the thresholds, $\eta_1$ and $\eta_2$, selective sampling can be based on the input power or log power instead of the input envelope. The block diagrams of two implementations of the second embodiment of the selective sampler are shown in FIGS. 9 and 10.

Figure 9:
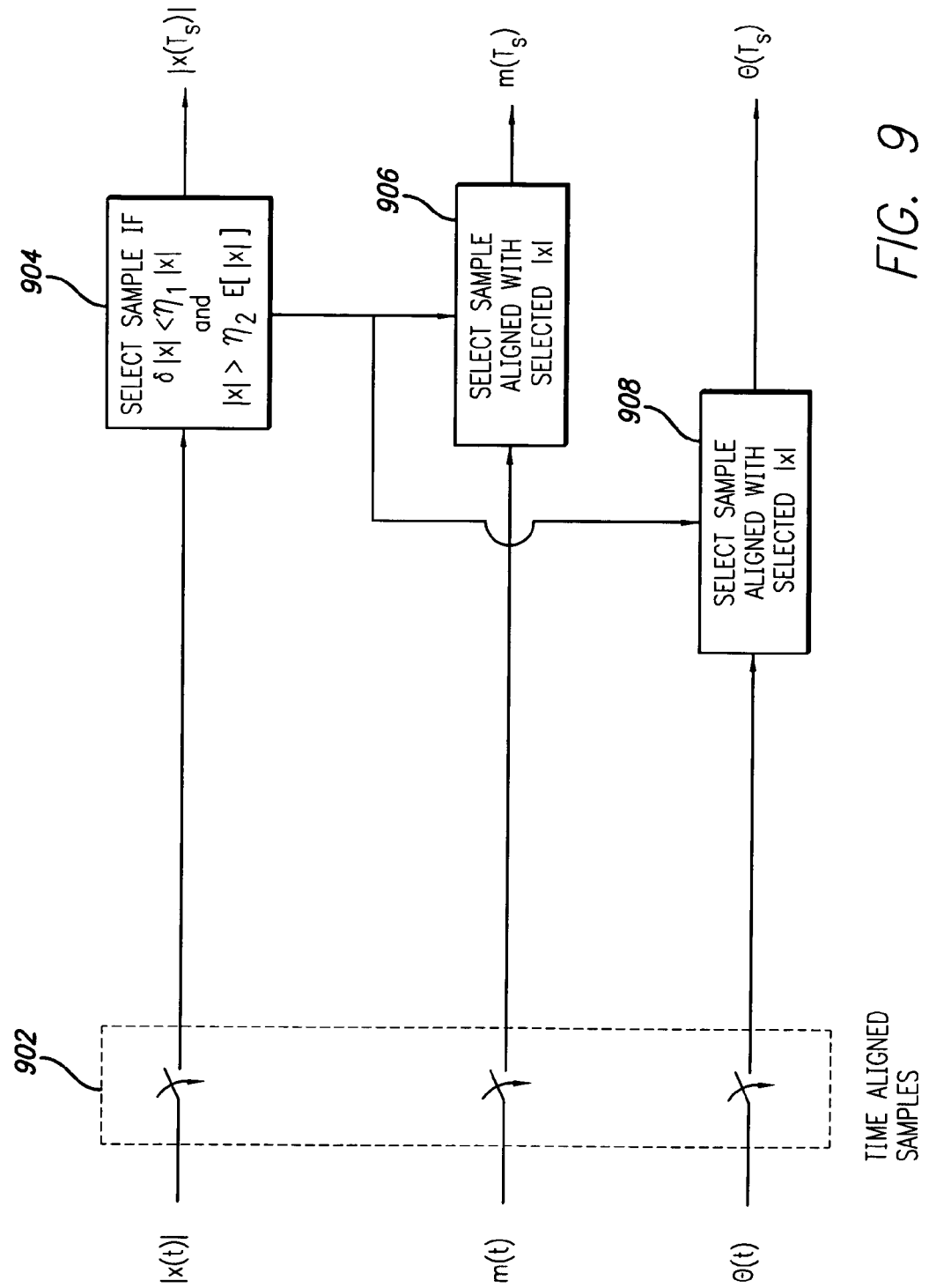
FIG. 9 is a second embodiment of a selective sampling circuit in accordance with the present invention with an analog input.

More specifically, referring to FIG. 9 an implementation of the second embodiment of the selective sampling circuit with an analog input is shown. This implementation may be employed for circuit 122 of FIG. 1 and the input signals may be time aligned analog signals (m, θ, |x|) as described therein. The analog input signals are converted to discrete samples at analog sampling circuit 902 which outputs digital samples for time aligned triples (m, θ, |x|). Sample selection circuit 904 uses the envelope sample and the above described criteria to make a sample selection decision. If the sample is selected a valid sample signal is output to magnitude and phase sample selection circuits 906, 908, respectively, which output the corresponding magnitude and phase samples.

Figure 10:
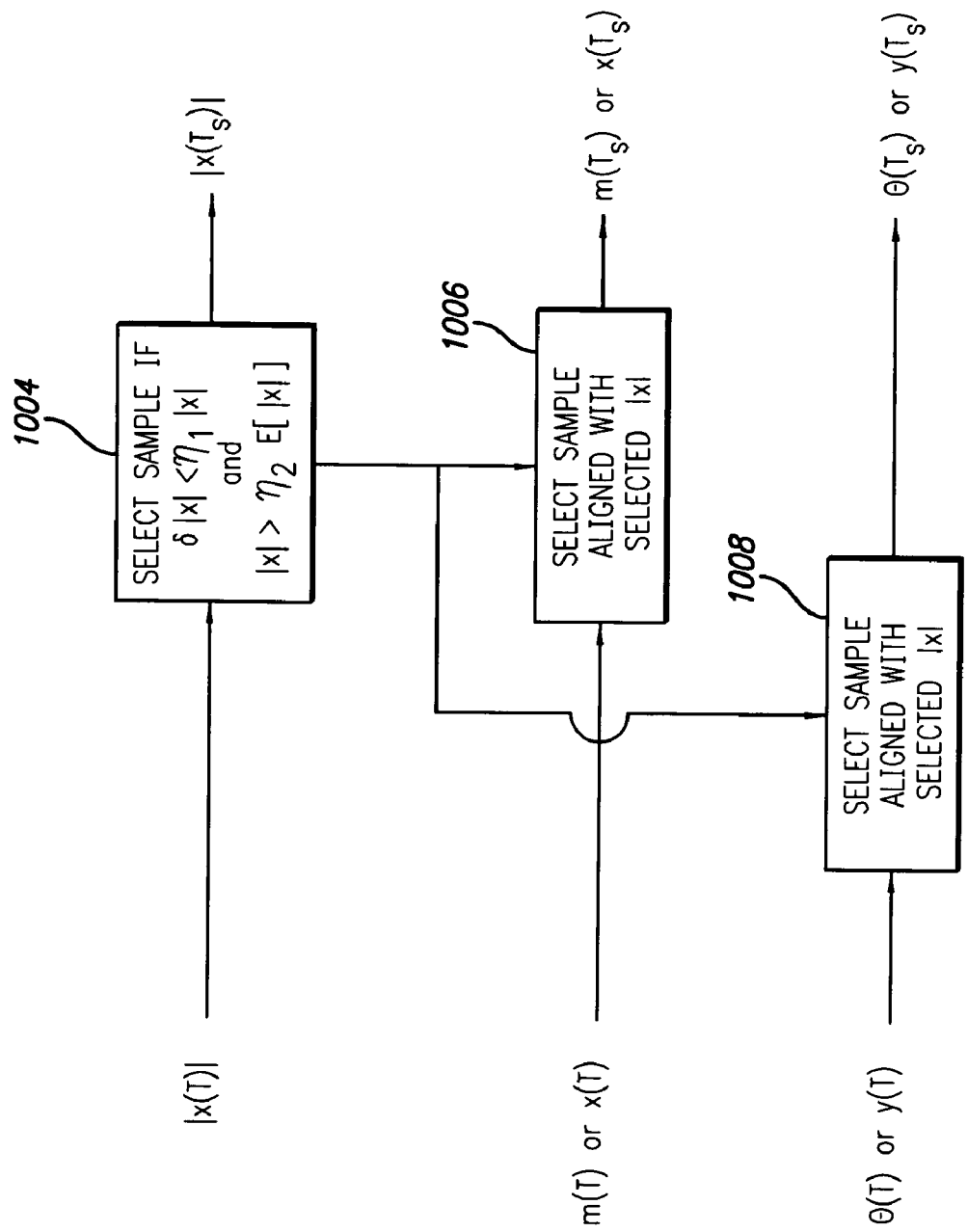
FIG. 10 is a second embodiment of a selective sampling circuit in accordance with the present invention with a digital input.

The implementation of the selective sampling circuit of FIG. 10 corresponds to the second embodiment described above operating on digital samples as inputs. This implementation may be employed for the systems of FIGS. 2-6 and the circuit receives time aligned triples (m, θ, |x|) or (x, y, |x|) depending of the embodiment. The operation of the circuit corresponds to that of FIG. 9 after sampling circuit 902 and circuit blocks 1004, 1006 and 1008 may correspond in function to blocks 904, 906, 908 described above.

Next the general operational considerations and results of the selective sampling approach will be described. The gain transfer characteristic of a power amplifier represents the fractional gain error ($G_{err}/G_0$) as a function of the input signal envelope, |x|. The magnitude and phase components are typically referred to as "AM-AM" and "AM-PM" curves. In the ideal case, the AM-AM and AM-PM curves are lines where each input level, |x|, maps to a single gain error (magnitude and phase). The goal of the predistortion module is to reduce the variance in the fractional gain error so that the lines are constant (flat) over the range of input levels, |x|.

Unfortunately, due to noise and time misalignment (including memory effects), there is a distribution of gain errors occurring at each input level. A memoryless predistortor does not correct this type of gain variance; its presence is viewed as undesirable noise to the tuning of the predistortion. If the noise is unbiased, convergence is possible but slow. If the noise is biased, the predistortion will be tuned incorrectly. The primary goal of the selective sampling is to reduce the gain variance within a given bin, |x|, by rejecting questionable data. The data reduction associated with the selective sampling process reduces the computational complexity of the estimator used to tune the predistortion coefficients.

Figure 11:
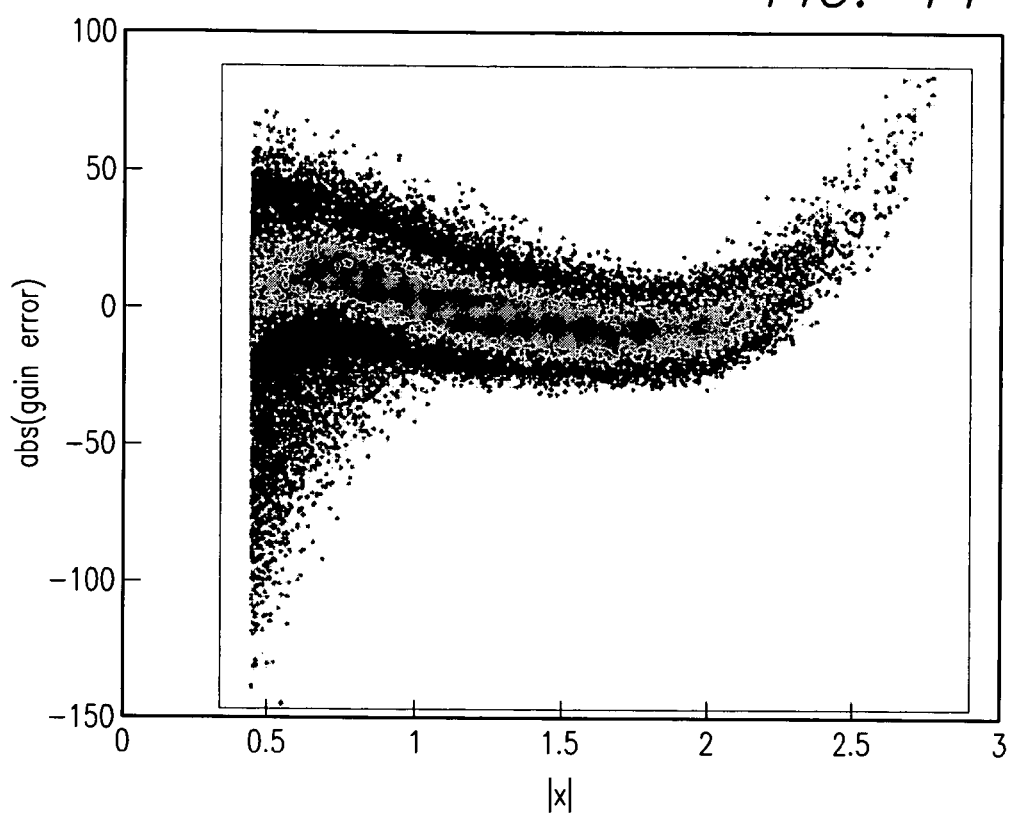
FIG. 11 is a plot showing the magnitude component of the gain error ($G_{err}$). Dark dots represent all samples; lighter dots are the samples selected using the first embodiment of the selective sampling circuit.
Figure 12:
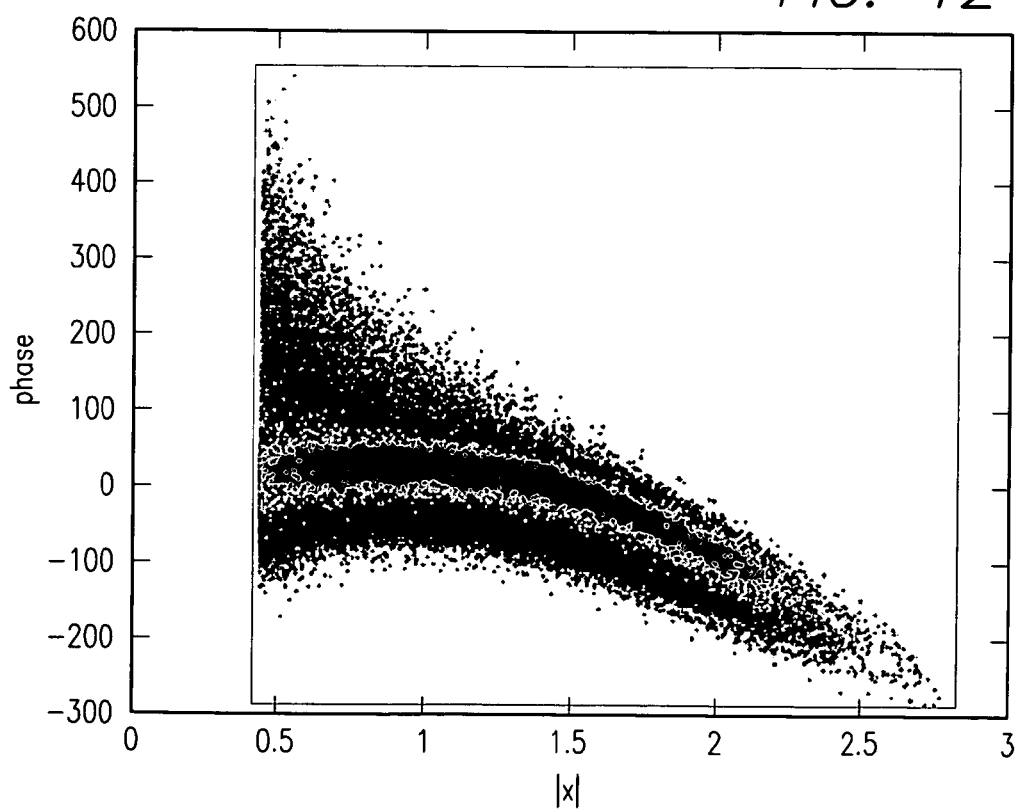
FIG. 12 is a plot showing the phase component of the gain error ($G_{err}$). Dark dots represent all samples; lighter dots are the samples selected using the first embodiment of the selective sampling circuit.

The differential measurements, plotted as a function of the input signal envelope, approximate the AM-AM and AM-PM curves. The magnitude and phase of the differential log measurements, after applying the first embodiment of the selective sampling to a single carrier WCDMA signal, are shown in FIG. 11 and FIG. 12, respectively. The original samples are also shown for ease of comparison. It is apparent that for a given input level, |x|, the selective sampling reduces the dispersion of the measurements.

The first embodiment of selective sampling (based on local peaks) reduces the amount of data being processed by the estimator, which tunes the predistortion coefficients. Only 2.1 percent of the original samples are accepted in the illustrated example. The magnitude and phase variances are reduced to 2.4 percent and 3.2 percent of the original samples, respectively. The shape of the AM-AM and AM-PM curves, as a function of the input level, is preserved as desired. The reduction in the variances is due to the unwanted dispersion being reduced.

Figure 13:
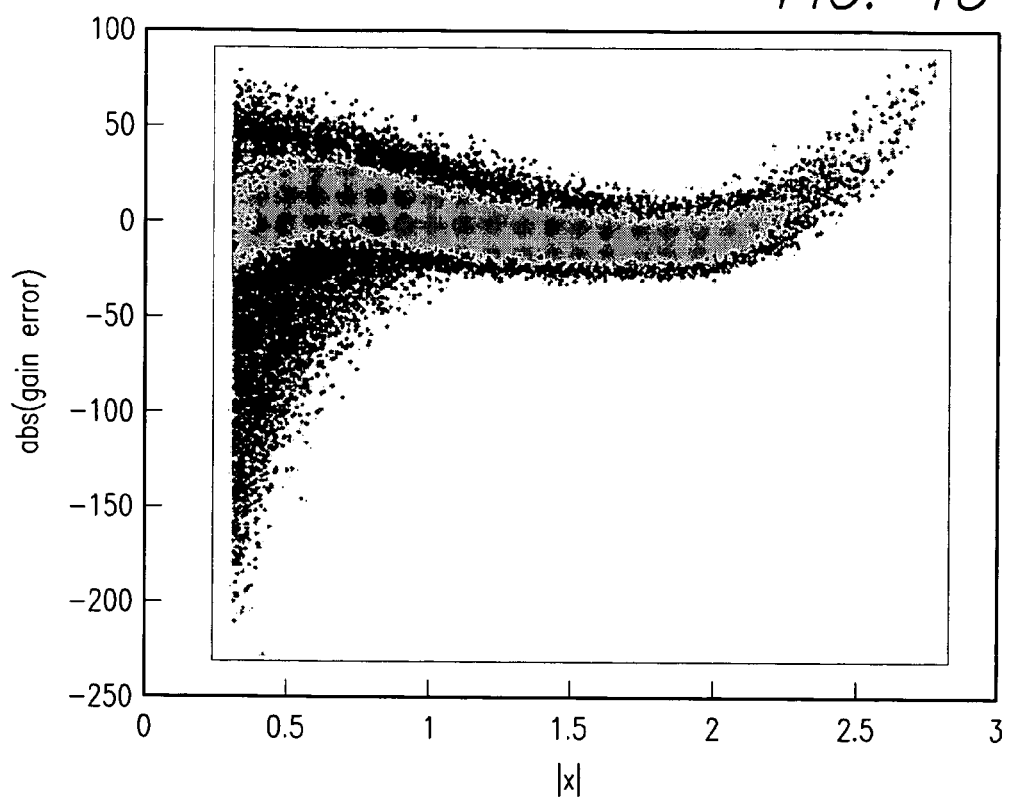
FIG. 13 is a plot showing the magnitude component of the gain error ($G_{err}$). Dark dots represent all samples; lighter dots are the samples selected using the second embodiment of the selective sampling circuit.
Figure 14:
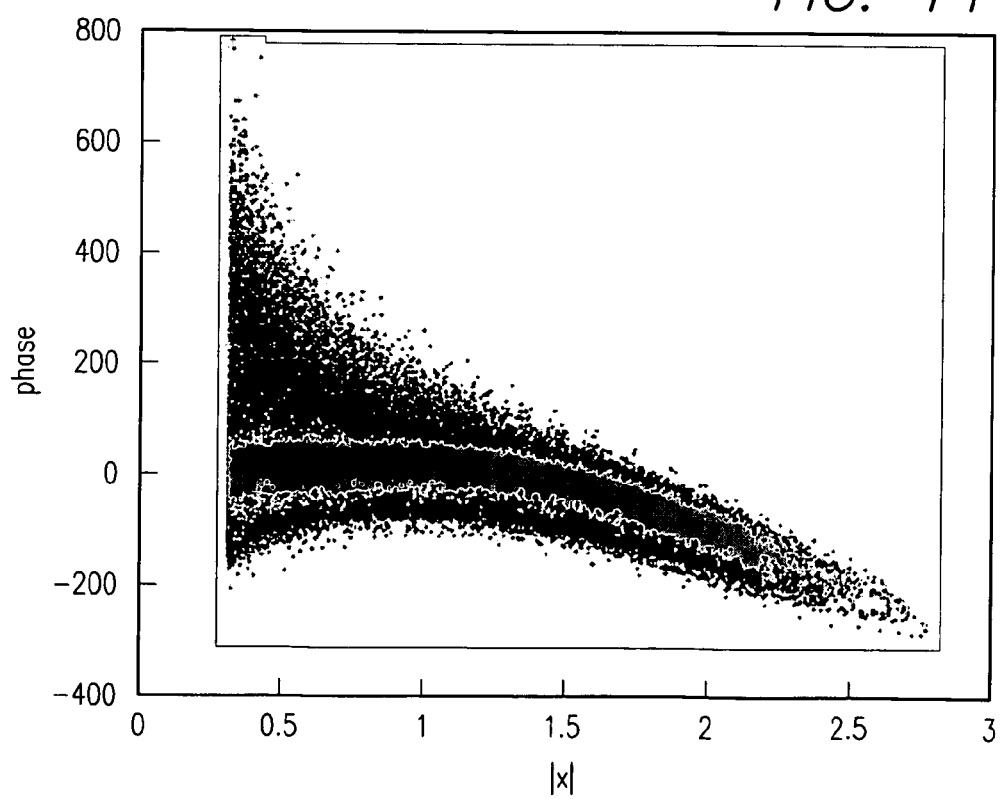
FIG. 14 is a plot showing the phase component of the gain error ($G_{err}$). Dark dots represent all samples; lighter dots are the samples selected using the second embodiment of the selective sampling circuit.

The magnitude and phase of the differential log measurements, after the second embodiment of the selective sampling is applied to a single carrier WCDMA signal, are shown in FIG. 13 and FIG. 14, respectively. For a given input level, |x|, the second embodiment of the selective sampling reduces the dispersion of the measurements compared to the original sample set, but the reduction is less than that of the first embodiment.

The selective sampling based on second embodiment also reduces the amount of data being processed by the estimator. However, the amount of data reduction can be controlled by the threshold selection, $\eta_1$. For $\eta_1=0.01$, 6.7 percent of the original samples are accepted. The magnitude and phase variances are reduced to 5.6 percent and 8.7 percent of the original samples. The shape of the AM-AM and AM-PM curves, as a function of the input level is preserved, as desired. The reduction in the variances is due to the unwanted dispersion being reduced.

For both the first and second embodiments of the selective sampling, there is significant data reduction obtained from selective sampling. The amount of reduction is dependent largely on the modulation signal format. The above examples used a WCDMA waveform, which is characterized by a large peak-to-average ratio of the signal power level. Most of the samples are very small or changing rapidly, leading to the rejection of many samples. However, the data reduction would be less pronounced for EDGE and reverse-link CDMA waveforms, which are designed to avoid zero crossings of the input magnitude.

In the above, an adaptive predistortion linearized amplifier system has been described wherein selective sampling is used to reduce the number of samples presented to the estimator. In one preferred embodiment a differential log detector is sampled and converted to digital at a specified periodic rate. It is possible to sample the differential log detector asynchronously based on the input signal envelope. That is, the differential log detector outputs are sampled only when local peaks in |x| are detected, for the first embodiment, or when (Eq. 28) is fulfilled, for the second embodiment. For asynchronous sampling, it is recommended that a minimum time interval between samples be enforced to avoid sending redundant (over-sampled) data to the estimator.

In view of the above, the present invention provides significant advantages. In particular, selective sampling in an adaptive predistortion linearized amplifier system reduces the number of samples processed by the estimator while improving the convergence of the tuning.

The present invention has been described in relation to presently preferred embodiments, however, it will be appreciated by those skilled in the art that a variety of modifications, too numerous to describe, may be made while remaining within the scope of the present invention. Accordingly, the above detailed description should be viewed as illustrative only and not limiting in nature.

What is claimed is:

1. An adaptive predistortion linearized amplifier system, comprising:
   an input receiving an input signal;
   a predistorter coupled to the input and performing a predistortion operation on the input signal using predistortion coefficients and providing a predistorted input signal;
   a power amplifier receiving and amplifying the predistorted input signal and providing an amplified signal;
   an output coupled to the power amplifier and providing the amplified signal as an output signal; and
   an adaptation circuit coupled to the input and output and receiving sampled input and output signals therefrom, the adaptation circuit comprising a selective sampling circuit providing a reduced number of samples derived from the sampled input and output signals using a signal characteristic related to the input signal magnitude and an estimator coupled to the selective sampling circuit and performing an adaptation operation using the reduced number samples to determine updated predistortion coefficients, wherein the adaptation circuit is coupled to the predistorter and provides said undated predistortion coefficients to the predistorter, wherein said adaptation circuit further comprises an envelope detector coupled to receive the sampled input signal, wherein said signal characteristic related to the input signal magnitude comprises the sampled input signal envelope and wherein said selective sampling circuit selects local peaks of the envelope.

2. An adaptive predistortion linearized amplifier system comprising:
   an input receiving an input signal;
   a predistorter coupled to the input and performing a predistortion operation on the input signal using predistortion coefficients and providing a predistorted input signal;
   a power amplifier receiving and amplifying the predistorted input signal and providing an amplified signal;
   an output coupled to the power amplifier and providing the amplified signal as an output signal; and
   an adaptation circuit coupled to the input and output and receiving sampled input and output signals therefrom, the adaptation circuit comprising a selective sampling circuit providing a reduced number of samples derived from the sampled input and output signals using a signal characteristic related to the input signal magnitude and an estimator coupled to the selective sampling circuit and performing an adaptation operation using the reduced number samples to determine undated predistortion coefficients, wherein the adaptation circuit is coupled to the predistorter and provides said updated predistortion coefficients to the predistorter, wherein said adaptation circuit further comprises an envelope detector coupled to receive the sampled input signal, wherein said signal characteristic related to the input signal magnitude comprises the rate of change of the sampled input signal envelope.

3. An adaptive predistortion linearized amplifier system as set out in claim 2, wherein said signal characteristic comprises the ratio of the rate of change of the sampled input signal envelope to the magnitude of the signal envelope.

4. An adaptive predistortion linearized amplifier system comprising:
an input receiving an input signal;
a predistorter coupled to the input and performing a predistortion operation on the input signal using predistortion coefficients and providing a predistorted input signal;
a power amplifier receiving and amplifying the predistorted input signal and providing an amplified signal;
an output coupled to the power amplifier and providing the amplified signal as an output signal; and
an adaptation circuit coupled to the input and output and receiving sampled input and output signals therefrom, the adaptation circuit comprising a selective sampling circuit providing a reduced number of samples derived from the sampled input and output signals using a signal characteristic related to the input signal magnitude and an estimator coupled to the selective sampling circuit and performing an adaptation operation using the reduced number samples to determine undated predistortion coefficients, wherein the adaptation circuit is coupled to the predistorter and provides said undated predistortion coefficients to the predistorter, wherein said adaptation circuit further comprises an envelope detector coupled to receive the sampled input signal, wherein the reduced number of samples provided to the estimator comprises a set of sample triples, each triple comprising a sample related to the difference in log magnitude between the sampled input signal and sampled output signal, a sample related to the difference in phase between the sampled input signal and the sampled output signal, and the sampled input signal envelope.

5. An adaptive predistortion linearized amplifier system comprising:
an input receiving an input signal;
a predistorter coupled to the input and performing a predistortion operation on the input signal using predistortion coefficients and providing a predistorted input signal;
a power amplifier receiving and amplifying the predistorted input signal and providing an amplified signal;
an output coupled to the power amplifier and providing the amplified signal as an output signal; and
an adaptation circuit coupled to the input and output and receiving sampled input and output signals therefrom, the adaptation circuit comprising a selective sampling circuit providing a reduced number of samples derived from the sampled input and output signals using a signal characteristic related to the input signal magnitude and an estimator coupled to the selective sampling circuit and performing an adaptation operation using the reduced number samples to determine undated predistortion coefficients, wherein the adaptation circuit is coupled to the predistorter and provides said updated predistortion coefficients to the predistorter, wherein said adaptation circuit further comprises an envelope detector coupled to receive the sampled input signal, wherein the reduced number of samples provided to the estimator comprises a set of sample triples, each triple comprising a sampled input signal, a time aligned sampled output signal, and a time aligned sampled input signal envelope.

6. An adaptive predistortion linearized amplifier system as set out in claim 1, wherein the input signal is an analog RF modulated signal and wherein said predistorter performs an analog predistortion operation on the input signal.

7. An adaptive predistortion linearized amplifier system comprising:
an input receiving an input signal;
a predistorter coupled to the input and performing a predistortion operation on the input signal using predistortion coefficients and providing a predistorted input signal;
a power amplifier receiving and amplifying the predistorted input signal and providing an amplified signal;
an output coupled to the power amplifier and providing the amplified signal as an output signal; and
an adaptation circuit coupled to the input and output and receiving sampled input and output signals therefrom, the adaptation circuit comprising a selective sampling circuit providing a reduced number of samples derived from the sampled input and output signals using a signal characteristic related to the input signal magnitude and an estimator coupled to the selective sampling circuit and performing an adaptation operation using the reduced number samples to determine undated predistortion coefficients, wherein the adaptation circuit is coupled to the predistorter and provides said undated predistortion coefficients to the predistorter;
wherein said input signal is a digital baseband signal, wherein said predistorter performs a digital predistortion operation on the input signal, and wherein said amplifier system further comprises a digital to analog converter and up converter circuit coupled between said predistorter and said power amplifier.

8. An adaptive predistortion linearized amplifier system comprising:
an input receiving an input signal;
a predistorter coupled to the input and performing a predistortion operation on the input signal using predistortion coefficients and providing a predistorted input signal;
a power amplifier receiving and amplifying the predistorted input signal and providing an amplified signal;
an output coupled to the power amplifier and providing the amplified signal as an output signal; and
an adaptation circuit coupled to the input and output and receiving sampled input and output signals therefrom, the adaptation circuit comprising a selective sampling circuit providing a reduced number of samples derived from the sampled input and output signals using a signal characteristic related to the input signal magnitude and an estimator coupled to the selective sampling circuit and performing an adaptation operation using the reduced number samples to determine undated predistortion coefficients, wherein the adaptation circuit is coupled to the predistorter and provides said updated predistortion coefficients to the predistorter, wherein said adaptation circuit further comprises an envelope detector coupled to receive the sampled input signal, wherein said adaptation circuit further comprises a differential log detector coupled to receive time aligned samples of the sampled input signal and sampled output signal and providing a sampled log magnitude difference signal related to the difference in log magnitude of the sampled input signal and sampled output signal and a sampled phase difference signal related to the difference in phase between the sampled input signal and sampled output signal.

9. An adaptive predistortion linearized amplifier system as set out in claim 8, wherein the sampled input signal envelope and the output of the differential log detector are provided to said selective sampling circuit.

10. An adaptive predistortion linearized amplifier system as set out in claim 8, wherein the output of the selective sampling circuit is provided to said differential log detector and wherein said differential log detector operates on a reduced set of sampled input signals and sampled output signals.

11. A method for adaptive predistortion of an amplifier system having an input, an output and a power amplifier, comprising:

receiving an input signal at the input of the amplifier system;

predistorting the input signal using predistortion coefficients;

amplifying the predistorted input signal and providing the amplified signal to the output as an output signal;

sampling the input signal to provide input signal samples;

sampling the output signal to provide output signal samples;

reducing the number of input and output samples using a characteristic of the input signal related to the input signal magnitude; and adaptively adjusting the predistortion coefficients using the reduced number of samples;

wherein reducing the number of input and output samples comprises detecting the envelope of the input signal and selecting input samples having an envelope value which is the peak value within a group of samples.

12. A method for adaptive predistortion of an amplifier as set out in claim 11, further comprising using said envelope values corresponding to said selected samples along with said selected samples for adaptively adjusting the predistortion coefficients.

13. A method for adaptive predistortion of an amplifier system having an input, an output and a power amplifier, comprising:

receiving an input signal at the input of the amplifier system;

predistorting the input signal using predistortion coefficients;

amplifying the predistorted input signal and providing the amplified signal to the output as an output signal;

sampling the input signal to provide input signal samples;

sampling the output signal to provide output signal samples;

reducing the number of input and output samples using a characteristic of the input signal related to the input signal magnitude; and adaptively adjusting the predistortion coefficients using the reduced number of samples;

wherein reducing the number of input and output samples comprises detecting the envelope of the input signal and selecting input samples having a rate of change in envelope value below a first threshold and an envelope value above a second threshold.

14. A method for selecting a subset of time aligned input and output samples of an amplifier system for use in adaptive predistortion of the amplifier system, comprising:

determining the value of the envelope of the input signal samples or another value related to the magnitude of the input signal;

comparing said value among a group of N samples;

selecting the input sample with the largest value in said group; and selecting an output sample time aligned with said selected input sample.

15. A method for selecting a subset of plural time aligned input and output samples of an amplifier system as set out in claim 14, further comprising determining if said input sample is at an endpoint of said group of N samples and only selecting said sample if said sample is not at an endpoint.

16. A method for selecting a subset of time aligned input and output samples of an amplifier system for use in adaptive predistortion of the amplifier system, comprising:

determining the value of the envelope of the input signal samples or another value related to the magnitude of the input signal;

determining the rate of change of said value;

comparing the rate of change to a threshold level;

selecting the input sample if the rate of change is below said threshold level; and selecting an output sample time aligned with said selected input sample.

17. A method for selecting a subset of plural time aligned input and output samples of an amplifier system as set out in claim 16, further comprising determining if the value is greater than a second threshold and only selecting said input sample if the value is greater than said second threshold.

* * * * *